(12) United States Patent
Kim et al.

(10) Patent No.: US 9,660,618 B2
(45) Date of Patent: May 23, 2017

(54) VOLTAGE LEVEL SHIFTER, AND EMBEDDED NONVOLATILE MEMORY AND SYSTEM USING THE SAME

(71) Applicant: SK hynix Inc., Gyeonggi-do (KR)

(72) Inventors: Jeong Hoon Kim, Gyeonggi-do (KR); Do Hee Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/940,200

(22) Filed: Nov. 13, 2015

(65) Prior Publication Data
US 2017/0019089 A1    Jan. 19, 2017

(30) Foreign Application Priority Data
Jul. 13, 2015 (KR) .................. 10-2015-0099305

(51) Int. Cl.
H03K 3/356 (2006.01)
(52) U.S. Cl.
CPC .............. H03K 3/356104 (2013.01)
(58) Field of Classification Search
CPC ...... H03G 11/00; H03G 11/002; H03K 19/00; H03K 19/00315; H03K 19/018528; H03K 3/00; H03K 3/356104; H04L 25/00; H04L 25/0278; H04L 25/0292
USPC ........................................................ 327/319
See application file for complete search history.

(56) References Cited

U.S. PATENT DOCUMENTS 7,453,742 B2    11/2008  Maejima et al.
2014/0176223 A1*  6/2014  Crespi ............ H03K 19/018528
                                                    327/333

* cited by examiner

*Primary Examiner* — Lincoln Donovan
*Assistant Examiner* — David Mattison
(74) *Attorney, Agent, or Firm* — IP & T Group LLP (57) ABSTRACT

A voltage level shifter may include a first input unit, a second input unit, a first mirror unit, a second mirror unit, and a clamping block. The first and second input units may receive a first input signal and a second input signal, respectively, and form current paths of a negative output node and a positive output node. The first and second mirror units may provide a first voltage to the negative output node and the positive output node. The clamping block may receive a second voltage, and couple the positive output node and the negative output node with the first and second mirror units, respectively.

15 Claims, 6 Drawing Sheets

| VIN | VINB | VOUTB | VOUT | P1 | P2 | Vgi(P1) | Vgi(P2) | Vgb(P1) | Vgb(P2) |
|---|---|---|---|---|---|---|---|---|---|
| H | L | 0 | VPP | OFF | ON | VPP | VX+Vth(P2) | 0 | VPP−(VX+Vth(P2)) |
| L | H | VPP | 0 | ON | OFF | VX+Vth(P1) | VPP | VPP−(VX+Vth(P1)) | 0 |

VOLTAGE LEVEL SHIFTER, AND EMBEDDED NONVOLATILE MEMORY AND SYSTEM USING THE SAME

CROSS-REFERENCES TO RELATED APPLICATION

The present application claims priority under 35 U.S.C. §119(a) to Korean application number 10-2015-0099305, filed on Jul. 13, 2015, which is herein incorporated by reference in its entirety.

BACKGROUND

1. Technical Field

Various embodiments generally relate to a semiconductor device, and, more particularly, to a voltage level shifter which amplifies an input signal or changes a voltage level.

2. Related Art

Electronic products for personal uses, such as a personal computer, a tablet PC, a laptop computer and a smart phone, may be configured by various electronic components. Electronic components may operate at different voltage levels, and may generate and use a higher level pumping voltage from a constant power supply voltage which is applied to an electronic product.

Recently, a solid state drive such as a data storage device capable of operating at a high speed has been developed. The solid state drive as a component for storing data includes a plurality of flash memories. A flash memory includes memory cells which use floating gates and uses a substantially high level of voltage as a program voltage due to its program operation characteristic that charges are accumulated in the floating gates. The flash memory may include circuits such as a voltage pumping circuit and a voltage level shifter to generate the program voltage.

In particular, since the voltage level shifter uses a pumping voltage such as a power supply voltage, a semiconductor device configuring the voltage level shifter is likely to break down. Specifically, the gate oxides of transistors which configure the voltage level shifter are likely to break down at a specific condition.

SUMMARY

In an embodiment, a voltage level shifter may include: a first input unit configured to receive a first input signal, and form a current path of a negative output node; a second input unit configured to receive a second input signal, and form a current path of a positive output node; a first mirror unit coupled with the positive output node, and configured to provide a first voltage to the negative output node; a second mirror unit coupled with the negative output node, and configured to provide the first voltage to the positive output node; and a clamping block configured to receive a second voltage, and couple the positive output node and the negative output node with the first and second mirror units, respectively.

In an embodiment, a voltage level shifter may include: a first input unit configured to receive a first input signal, and couple a negative output node with a terminal of a ground voltage; a second input unit configured to receive a second input signal, and couple a positive output node with the terminal of the ground voltage; a first mirror unit coupled with the positive output node, and configured to provide a pumping voltage to the negative output node; a second mirror unit coupled with the negative output node, and configured to provide the pumping voltage to the positive output node; a first clamping unit configured to receive a clamping voltage, and couple the positive output node and the first mirror unit; and a second clamping unit configured to receive the clamping voltage, and couple the negative output node and the second mirror unit.

DETAILED DESCRIPTION

Hereinafter, a voltage level shifter, and an embedded nonvolatile memory and a system using the same will be described below with reference to the accompanying drawings through various examples of embodiments.

Figure 1:
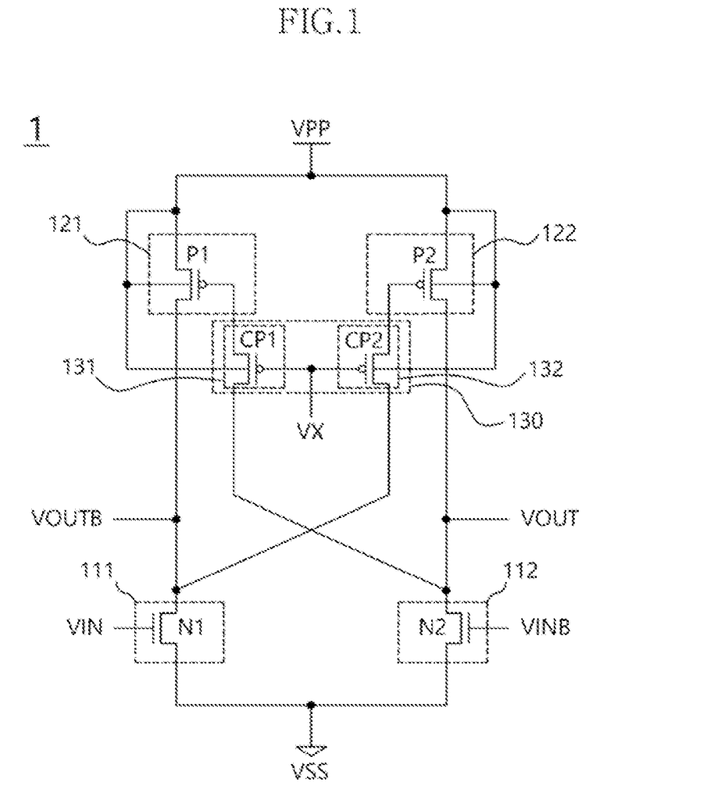
FIG. 1 is a diagram illustrating a representation of an example of the configuration of a voltage level shifter in accordance with an embodiment.

FIG. 1 is a diagram illustrating a representation of an example of the configuration of a voltage level shifter 1 in accordance with an embodiment. In FIG. 1, the voltage level shifter 1 may operate by receiving a first voltage, a second voltage and a third voltage. The first voltage may have a level higher than the second voltage, and the second voltage may have a level higher than, the third voltage. The first voltage as a power supply voltage of the voltage level shifter 1 may be a high voltage or a pumping voltage VPP with a high level. The pumping voltage VPP may be generated through a pumping circuit which pumps an external voltage of a relatively low level. The third voltage may be a ground voltage VSS. The level of the second voltage will be described later.

The voltage level shifter 1 may include a first input unit 111, a second input unit 112, a first mirror unit 121, a second mirror unit 122, and a clamping block 130. The first input unit 111 receives a first input signal VIN. The first input unit 111 may be coupled between a negative output node VOUTB and the terminal of the third voltage, that is, the ground voltage VSS, and may couple the negative output node VOUTB with the terminal of the ground voltage VSS in response to the first input signal VIN. Accordingly, the first input unit 111 may form the current path of the negative output node VOUTB in response to the first input signal VIN.

The second input unit 112 receives a second input signal VINB. Without a limiting sense, the second input signal VINB may be a complementary signal with respect to the first input signal VIN. For example, the second input signal VINB may be a low level signal when the first input signal VIN is a high level signal, and the second input signal VINB may be a high level signal when the first input signal VIN is a low level signal. The second input unit 112 may be coupled between a positive output node VOUT and the terminal of the ground voltage VSS, and may couple the positive output node VOUT with the terminal of the ground voltage VSS in response to the second input signal VINB. Accordingly, the second input unit 112 may form the current path of the positive output node VOUT in response to the second input signal VINB.

The first and second input signals VIN and VINB may have levels of external voltages relatively lower than the pumping voltage VPP. In this case, the voltage level shifter 1 may convert an input signal of a relatively low level into an output signal with a high level.

The first mirror unit 121 may be coupled between the terminal of the first voltage, that is, the pumping voltage VPP, and the negative output node VOUTB. Also, the first mirror unit 121 may be coupled with the positive output node VOUT, and provide the pumping voltage VPP to the negative output node VOUTB according to the voltage level of the positive output node VOUT. The second mirror unit 122 may be coupled between the terminal of the pumping voltage VPP and the positive output node VOUT. Also, the second mirror unit 122 may be coupled with the negative output node VOUTB, and provide the pumping voltage VPP to the positive output node VOUT according to the voltage level of the negative output node VOUTB.

The clamping block 130 may receive a second voltage VX, and couple the first and second mirror units 121 and 122 with the positive output node VOUT and the negative output node VOUTB, respectively. The clamping block 130 may include first and second clamping units 131 and 132. The first clamping unit 131 may receive the second voltage VX and couple the first mirror unit 121 and the positive output node VOUT, and the second clamping unit 132 may receive the second voltage VX and couple the second mirror unit 122 and the negative output node VOUTB. Due to the fact that the first and second clamping units 131 and 132 respectively receive the second voltage VX and couple the first and second mirror units 121 and 122 with the positive output node VOUT and the negative output node VOUTB, respectively, it is possible to clamp the voltages applied to the first mirror unit 121 and the second mirror unit 122.

In FIG. 1, the first input unit 111 may include a first NMOS transistor N1. The first NMOS transistor N1 may have a gate which receives the first input signal VIN, a drain which is coupled with the negative output node VOUTB and a source which is coupled with the terminal of the ground voltage VSS. The second input unit 112 may include a second NMOS transistor N2. The second NMOS transistor N2 may have a gate which receives the second input signal VINB, a drain which is coupled with the positive output node VOUT and a source which is coupled with the terminal of the ground voltage VSS.

The first clamping unit 131 may include a first clamping transistor CP1. The first clamping transistor CP1 may be a PMOS transistor. The first clamping transistor CP1 may have a gate which receives the second voltage VX, a source which is coupled with the first mirror unit 121 and a drain which is coupled with the positive output node VOUT. The second clamping unit 132 may include a second clamping transistor CP2. The second clamping transistor CP2 may be a PMOS transistor. The second clamping transistor CP2 may have a gate which receives the second voltage VX, a source which is coupled with the second mirror unit 122 and a drain which is coupled with the negative output node VOUTB. The pumping voltage VPP may be biased to the bodies of the first and second clamping transistors CP1 and CP2.

The first mirror unit 121 may include a first PMOS transistor P1. The first PMOS transistor P1 may have a gate which is coupled with the source of the first clamping transistor CP1, a source which receives the pumping voltage VPP and a drain which is coupled with the negative output node VOUTB. The second mirror unit 122 may include a second PMOS transistor P2. The second PMOS transistor P2 may have a gate which is coupled with the source of the second clamping transistor CP2, a source which receives the pumping voltage VPP and a drain which is coupled with the positive output node VOUT. The pumping voltage VPP may be biased to the bodies of the first and second PMOS transistors P1 and P2.

In the embodiment, the second voltage VX may have a level lower than the pumping voltage VPP. The second voltage VX may be between the pumping voltage VPP and a voltage corresponding to the operation range of the transistors which are included in the first and second mirror units 121 and 122. For instance, in the case in which the level of the pumping voltage VPP is 20V and the operation range of the first and second PMOS transistors P1 and P2 is 6V, the second voltage VX may be 14V.

Figure 2:
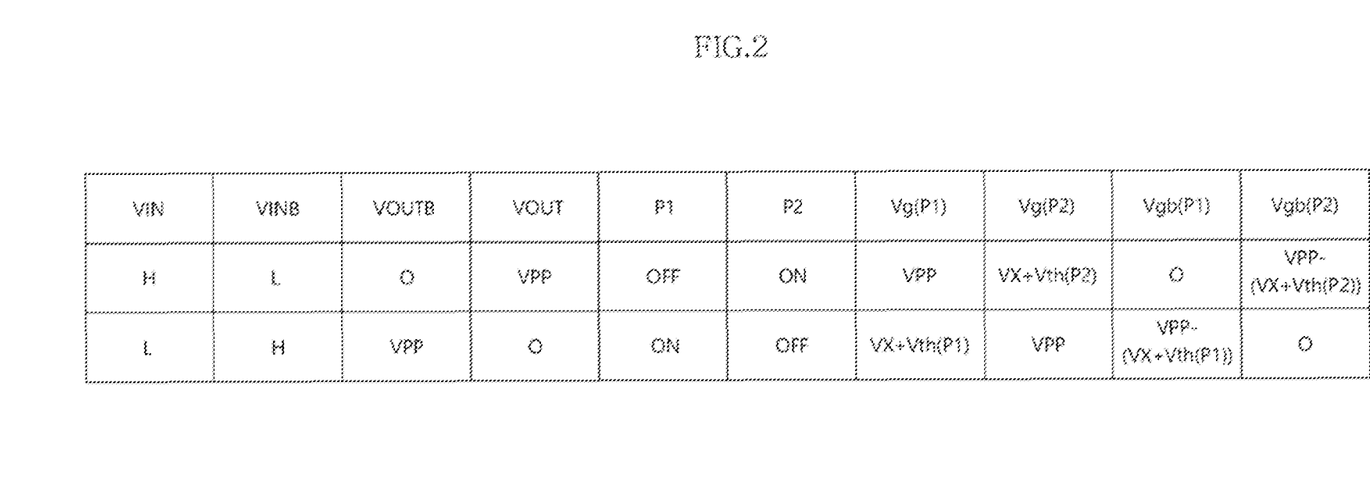
FIG. 2 is an example of a table used to describe the operation of the voltage level shifter shown in FIG. 1.

FIG. 2 is an example of a table to use in describing the operation of the voltage level shifter 1 shown in FIG. 1. The operation of the voltage level shifter 1 in accordance with the embodiment will be described below with reference to FIGS. 1 and 2. First, when the first input signal VIN is a high level, the second input signal VINB may be a low level. The first NMOS transistor N1 may be turned on by receiving the first input signal VIN, and couple the negative output node VOUTB and the terminal of the ground voltage VSS. The second NMOS transistor N2 is turned off by receiving the second input signal VINB. As the negative output node VOUTB is coupled with the terminal of the ground voltage VSS, a current path is formed, and the voltage level of the negative output node VOUTB may become lower than the voltage level of the positive output node VOUT. The first PMOS transistor P1 may be turned off in response to the voltage level of the positive output node VOUT which is relatively high, and may not provide the pumping voltage VPP to the negative output node VOUTB. Conversely, the second PMOS transistor P2 may be turned on in response to the voltage level of the negative output node VOUTB which is relatively low, and may provide the pumping voltage VPP to the positive output node VOUT. Accordingly, the voltage level of the positive output node VOUT may approach the level of the pumping voltage VPP, and the voltage level of the negative output node VOUTB may approach the level of the ground voltage VSS.

A voltage Vg(P1) which is applied to the gate of the first PMOS transistor P1 may be substantially the pumping voltage VPP, and accordingly, a voltage difference Vgb(P1) between the gate and the body of the first PMOS transistor P1 may be 0. When assuming that the second clamping unit 132 does not exist, a voltage Vg(P2) which is applied to the gate of the second PMOS transistor P2 may be substantially the ground voltage VSS. Therefore, a voltage difference Vgb(P2) between the gate and the body of the second PMOS transistor P2 may correspond to the level of the pumping voltage VPP.

As the voltage difference Vgb(P2) between the gate and the body increases, the possibility that the gate oxide of the second PMOS transistor P2 breaks down significantly increases. Since the voltage difference Vgb(P2) between the gate and the body of the second PMOS transistor P2 corresponds to the level of the pumping voltage VPP, the gate oxide of the second PMOS transistor P2 is likely to break down when the second PMOS transistor P2 is turned on. In order to prevent this, the second clamping unit 132 may clamp the voltage applied to the gate of the second PMOS transistor P2.

Since the second clamping transistor CP2 receives the second voltage VX through the gate and receives a voltage corresponding to the ground voltage VSS through the drain, the voltage level of the source of the second clamping transistor CP2 may correspond to the level of the second voltage VX. Accordingly, a voltage Vg(P2) applied to the gate of the second PMOS transistor P2 may be a voltage VX+Vth(P2) of a magnitude that is obtained by adding the second voltage VX and a threshold voltage Vth(P2) of the second PMOS transistor P2. Since a voltage difference Vgb(P2) between the gate and the body of the second PMOS transistor P2 is VPP−(VX+Vth(P2)), a voltage level corresponding to the operation range of the second PMOS transistor P2 may be obtained. In this way, the second clamping unit 132 may significantly decrease the possibility that the gate oxide of the second PMOS transistor P2 breaks down.

Next, when the first input signal VIN is a low level, the second input signal VINB may be a high level. The first NMOS transistor N1 is turned off by receiving the first input signal VIN. The second NMOS transistor N2 may be turned on by receiving the second input signal VINB, and couple the positive output node VOUT and the terminal of the ground voltage VSS. As the positive output node VOUT is coupled with the terminal of the ground voltage VSS, a current path is formed, and the voltage level of the positive output node VOUT may become lower than the voltage level of the negative output node VOUTB. The first PMOS transistor P1 may be turned on in response to the voltage level of the positive output node VOUT which is relatively low, and may provide the pumping voltage VPP to the negative output node VOUTB. Conversely, the second PMOS transistor P2 may be turned off in response to the voltage level of the negative output node VOUTB which is relatively high, and may not provide the pumping voltage VPP to the positive output node VOUT. Accordingly, the positive output node VOUT may be a voltage level substantially approaching the ground voltage VSS, and the voltage level of the negative output node VOUTB may be a voltage level substantially approaching the pumping voltage VPP.

A voltage Vg(P2) which is applied to the gate of the second PMOS transistor P2 may be substantially the pumping voltage VPP, and accordingly, a voltage difference Vgb(P2) between the gate and the body of the second PMOS transistor P2 may be 0.

Presuming that the first clamping unit 131 does not exist, a voltage Vg(P1) applied to the gate of the first PMOS transistor P1 may be a voltage which approaches the ground voltage VSS. Therefore, a voltage difference Vgb(P1) between the gate and the body of the first PMOS transistor P1 may correspond to the level of the pumping voltage VPP. As the voltage difference Vgb(P1) between the gate and the body increases, the possibility that the gate oxide of the first PMOS transistor P1 breaks down increases substantially. Since the voltage difference Vgb(P1) between the gate and the body of the first PMOS transistor P1 corresponds to the level of the pumping voltage VPP, the gate oxide of the first PMOS transistor P1 is likely to break down when the first PMOS transistor P1 is turned on. In order to substantially prevent this, the first clamping unit 131 may clamp the voltage applied to the gate of the first PMOS transistor P1.

Since the first clamping transistor CP1 receives the second voltage VX through the gate and receives a voltage corresponding to the ground voltage VSS through the drain, the voltage level of the source of the first clamping transistor CP1 may correspond to the level of the second voltage VX. Accordingly, a voltage Vg(P1) applied to the gate of the first PMOS transistor P1 may be a voltage VX+Vth(P1) of a magnitude that is obtained by adding the second voltage VX and a threshold voltage Vth(P1) of the first PMOS transistor P1. Since a voltage difference Vgb(P1) between the gate and the body of the first PMOS transistor P1 is VPP−(VX+Vth(P1)), a voltage level corresponding to the operation range of the first PMOS transistor P1 may be obtained. In this way, the first clamping unit 131 may significantly decrease the possibility that the gate oxide of the first PMOS transistor P1 breaks down.

In the embodiment, the clamping block 130 may function effectively as the pumping voltage VPP using the power supply voltage of the voltage level shifter 1 has a higher level. In particular, the voltage level shifter 1 may be applied to a flash memory system which uses a high level voltage to program data.

Figure 3:
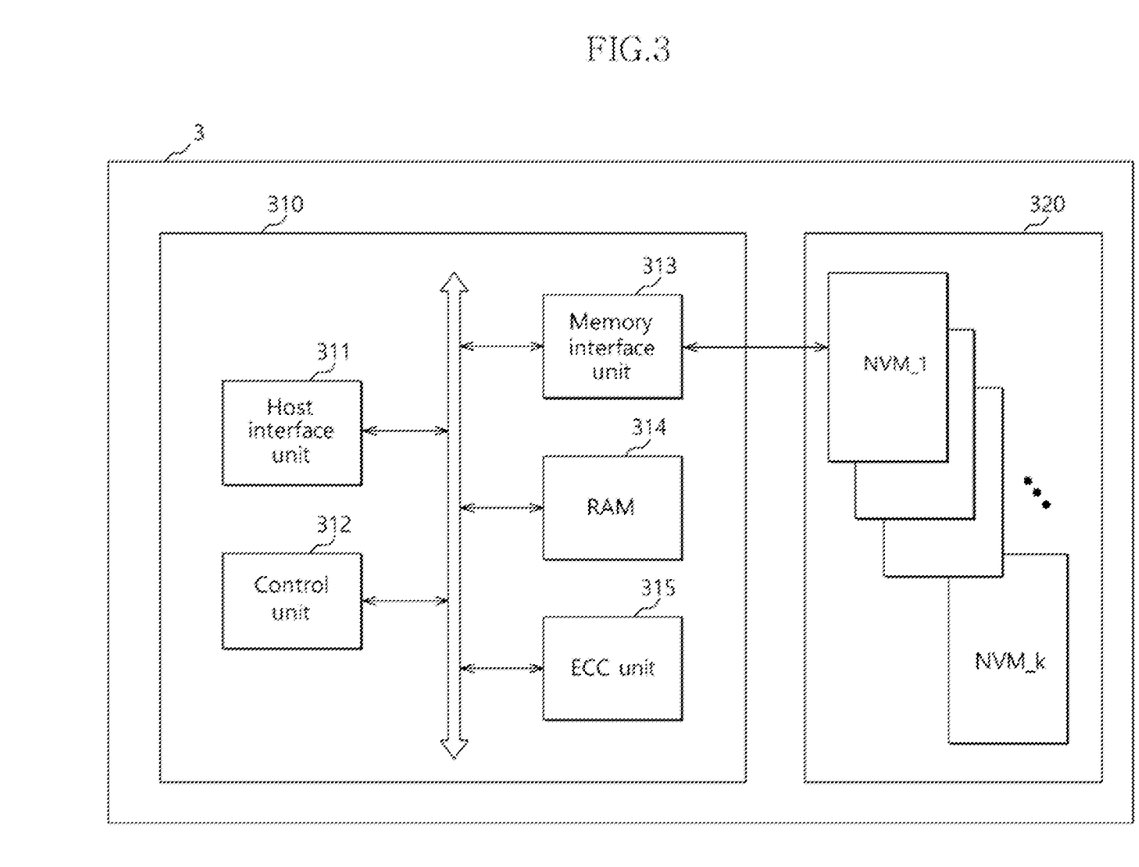
FIG. 3 is a diagram illustrating an example of the configuration of a data storage device in accordance with an embodiment.

FIG. 3 is a bock diagram illustrating an example of the configuration of a data storage device 3 in accordance with an embodiment. The components of the data storage device 3 may use the voltage level shifter 1 in accordance with the embodiment, and the voltage level shifter 1 may be included in, for example, a nonvolatile memory device 320 which is used in the data storage device 3.

The data storage device 3 may include a controller 310 and the nonvolatile memory device 320. The data storage device 3 may be coupled to a host device (not shown) such as a mobile phone, an MP3 player, a laptop computer, a desktop computer, a game player, a TV, an in-vehicle infotainment system, and so forth.

The controller 310 may be configured to access the nonvolatile memory device 320 in response to a request from the host device. For example, the controller 310 may be configured to control read, program or erase operations of the nonvolatile memory device 320. The controller 310 may be configured to drive firmware or software for controlling the nonvolatile memory device 320.

The controller 310 may include a host interface unit 311, a control unit 312, a memory interface unit 313, a RAM 314, and an error correction code (ECC) unit 315. The control unit 312 may be configured to control the general operations of the controller 310 in response to a request from the host device.

The RAM 314 may be used as the working memory of the control unit 312. In another embodiment, the RAM 314 may be used as a buffer memory which temporarily stores the data read from the nonvolatile memory device 320 or the data provided from the host device.

The host interface unit 311 may be configured to interface the host device and the controller 310. For example, the host interface unit 311 may be configured to communicate with the host device through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, and a serial attached SCSI (SAS) protocol.

The memory interface unit 313 may be configured to interface the controller 310 and the nonvolatile memory device 320. The memory interface unit 313 may be configured to provide commands and addresses to the nonvolatile memory device 320. Furthermore, the memory interface unit 313 may be configured to exchange data with the nonvolatile memory device 320.

The error correction code unit 315 may be configured to detect an error of data read from the nonvolatile memory device 320. Also, the error correction code unit 315 may be configured to correct a detected error when the detected error is within a correctable range.

The nonvolatile memory device 320 may be used as a storage medium of the data storage device 3. The nonvolatile memory device 320 may include a plurality of nonvolatile memory chips (or dies) NVM_1 to NVM_k.

The controller 310 and the nonvolatile memory device 320 may be manufactured as any one of various data storage devices. For example, the controller 310 and the nonvolatile memory device 320 may be integrated into one semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a Personal Computer Memory Card International Association (PCMCIA) card, a compact flash (CF) card, a smart media card, a memory stick, and so forth.

The voltage level shifter 1 in accordance with the embodiment may be applied to an embedded nonvolatile memory (eNVM). The embedded nonvolatile memory may be embedded in a controller chip such as a processor. A nonvolatile memory may be manufactured together with the processor through the same process. The voltage level shifter 1 in accordance with the embodiment may be used as a component of the embedded nonvolatile memory.

Figure 4:
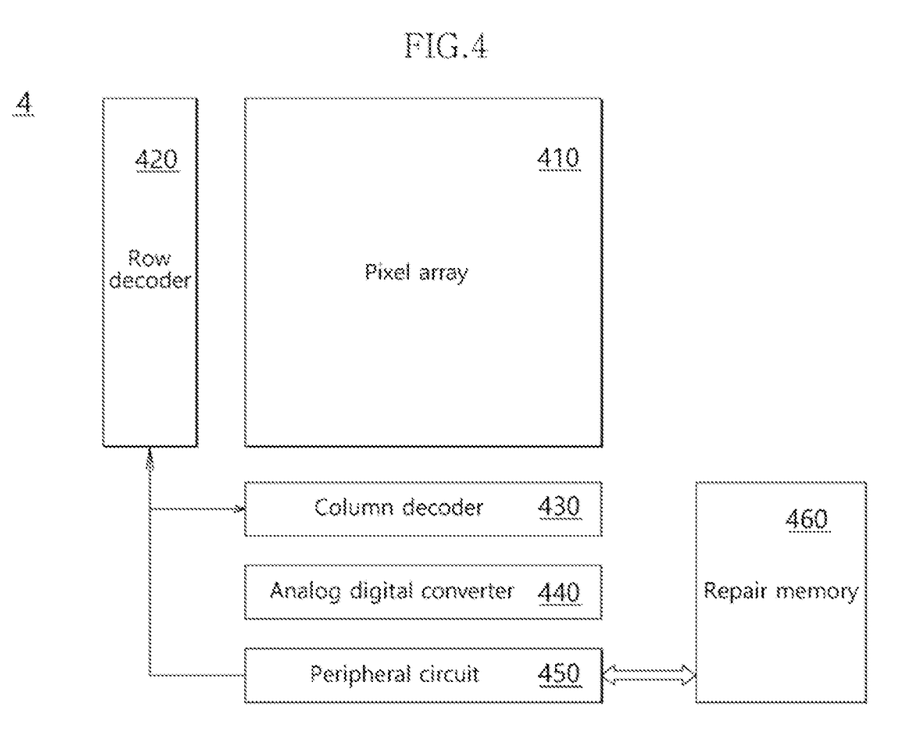
FIG. 4 is a diagram illustrating an example of the configuration of an image sensor in accordance with an embodiment.
Figure 5:
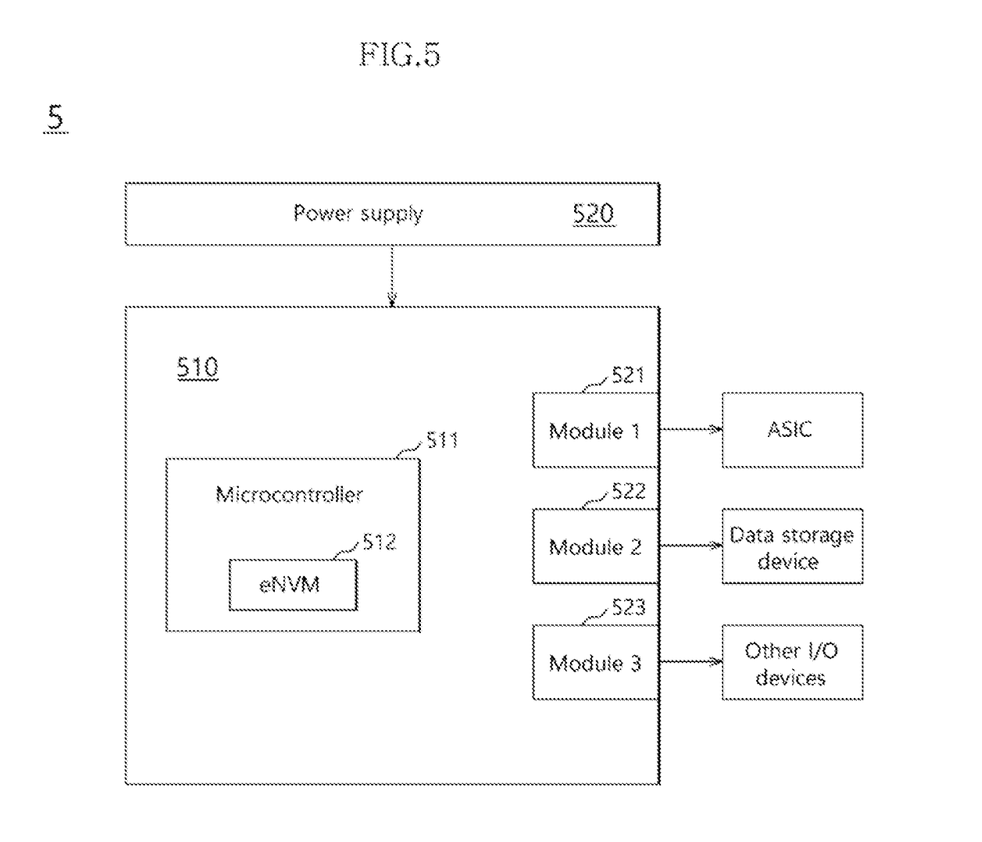
FIG. 5 is a diagram illustrating an example of the configuration of a power management system in accordance with an embodiment.
Figure 6:
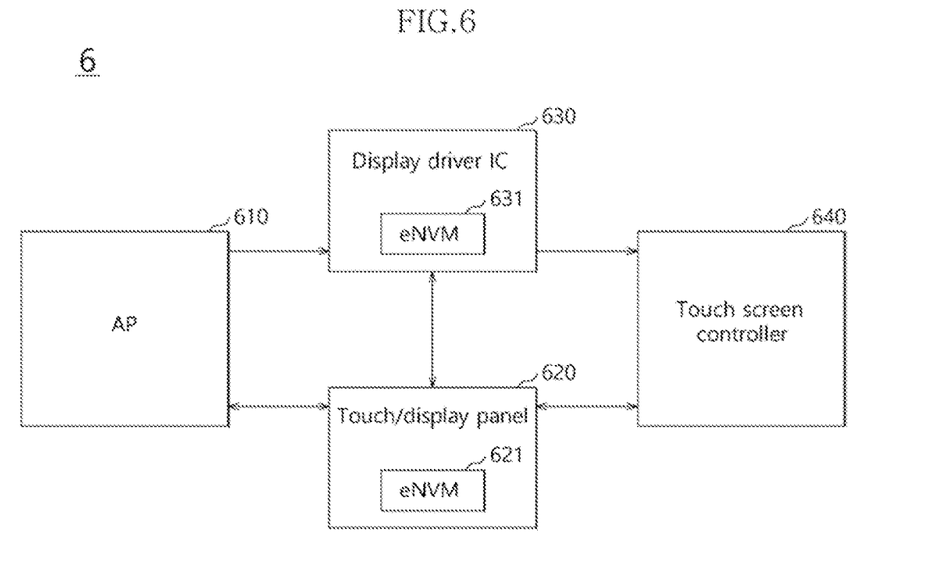
FIG. 6 is a diagram illustrating an example of the configuration of a touch screen display device in accordance with an embodiment.

FIGS. 4 to 6 are diagrams illustrating examples of systems including, an embedded nonvolatile memory, utilizing the voltage level shifter 1 in accordance with the embodiment. FIG. 4 is a diagram illustrating an example of the configuration of an image sensor 4 in accordance with an embodiment.

In FIG. 4, the image sensor 4 may include a pixel array 410, a row decoder 420, a column decoder 430, an analog digital converter 440, and a peripheral circuit 450. The pixel array 410 may have a matrix structure in which a plurality of row lines (not shown) and a plurality of column lines (not shown) cross each other. The numbers of the row lines and the column lines may vary.

The row decoder 420 and the column decoder 430 may select a certain row line and a certain column line among the plurality of row lines and the plurality of column lines to read out information of a desired pixel. The analog digital converter 440 may convert the information stored in the pixel, which is selected by the row decoder 420 and the column decoder 430, into a digital signal. The peripheral circuit 450 may include logic circuits for processing the digital signal outputted from the analog digital converter 440 and outputting a resultant signal to an external device. Also, the peripheral circuit 450 may include a logic circuit for repairing a damaged pixel.

The image sensor 4 may further include a repair memory 460. The repair memory 460 may include position information of a damaged or failed pixel. The repair memory 460 may store repair information, provide the repair information to the peripheral circuit 450, and replace a row line or a column line, to which a failed pixel is coupled, with a redundancy line when the row decoder 420 and the column decoder 430 select the failed pixel. The repair memory 460 may be a one-time programmable memory and may be an embedded nonvolatile memory. Since the repair memory 460 may use power with a higher level than other components, the voltage level shifter 1 of FIG. 1 may be used.

FIG. 5 is a diagram illustrating an example of the configuration of a power management system 5 in accordance with an embodiment. The power management system 5 may include a power management integrated circuit 510 and a power supply 520. The power management integrated circuit 510 may be supplied with power from the power supply 520. The power supply 520 may convert alternate current supplied from an exterior into direct current to be stably used in the power management system 5. Further, a battery may be used as a power source such as the power supply 520. The power management integrated circuit 510 may be coupled with various devices. For example, the power management integrated circuit 510 may be coupled with a system IC such as an application specific integrated circuit (ASIC), a data storage device and other input/output devices. The data storage device may include a large capacity storage device including a plurality of flash memories. The power management integrated circuit 510 may convert the power applied from the power supply 520 into power appropriate for respective devices and provide the converted power to the respective devices.

The power management integrated circuit 510 may include a microcontroller 511, and a plurality of modules 521, 522 and 523. The microcontroller 511 may include power information appropriate for the devices and may store and execute sequences or algorithms for generating the appropriate power. The plurality of modules 521, 522 and 523 may be coupled with the respective devices and may include voltage regulators or the likes for providing power to the respective devices.

The microcontroller 511 may include a register for storing the sequences or algorithms, and the register may include an embedded nonvolatile memory (eNVM) 512. The embedded nonvolatile memory 512 may store the power information of the devices, the sequences to be executed by the microcontroller 511, and/or the trimming information of the plurality of modules 521, 522 and 523. The embedded nonvolatile memory may include a voltage level shifter for converting an input signal with a certain voltage level into a signal with a higher voltage level and the voltage level shifter 1 shown in FIG. 1 may be used.

FIG. 6 is a diagram illustrating an example of the configuration of a touch screen display device 6 in accordance with an embodiment. In FIG. 6, the touch screen display device 6 may include an application processor 610, a touch screen controller 620, a display driver integrated circuit 630, and a touch and display panel 640. The application processor 610 may communicate with the touch screen controller 620 and the display driver integrated circuit 630. The application processor 610 may recognize a touch input of a user by being supplied with a touch signal processed from the touch screen controller 620 and may supply a display signal to the touch screen controller 620 and the display driver integrated circuit 630. The display signal may include display data, a driving signal or power for driving a display panel.

The touch screen controller 620 may include a microprocessor capable of executing an algorithm for converting a touch input of a user into a touch signal and transmitting the touch signal to the application processor 610. The touch screen controller 620 may include an embedded nonvolatile memory (eNVM) 621 which stores the algorithm. The embedded nonvolatile memory 621 may use the voltage level shifter 1 shown in FIG. 1 to communicate with the microprocessor.

The display driver integrated circuit 630 may receive display data and a driving signal from the application processor 610 and the touch screen controller 620 and drive the touch and display panel 640. The display driver integrated circuit 630 may include a timing control unit which drives the touch and display panel 640 corresponding to the display data and the driving signal received from the application processor 610 and the touch screen controller 620. Furthermore, the display driver integrated circuit 630 may further include at least one analog circuit in addition to the timing control unit. The display driver integrated circuit 630 may include an embedded nonvolatile memory (eNVM) 631 for storing timing information of the timing control unit and storing the characteristic of the analog circuit. The embedded nonvolatile memory 631 may use the voltage level shifter 1 shown in FIG. 1 to communicate with the timing control unit and the analog circuit.

The touch and display panel 640 may include sensing electrodes for recognizing a touch input of a user and a plurality of pixels which are driven in correspondence to display data and a driving signal from the display driver integrated circuit 630. The touch and display panel 640 may receive a signal such as a touch driving signal, for example, from the touch screen controller 620, and may transmit a signal such as a touch sensing signal sensed due to a capacitance change occurring in the sensing electrodes when the touch driving signal is supplied, to the touch screen controller 620. Moreover, the touch and display panel 640 may be driven by the display driver integrated circuit 630, and display an image corresponding to the display data and the driving signal. The structure and the driving method of the touch and display panel 640 may be changed in a variety of ways according to various driving schemes such as a resistive scheme, a capacitive scheme and an optical detection scheme, and may be realized as an organic electroluminescent display panel or a liquid crystal display panel.

While various embodiments have been described above, it will be understood to those skilled in the art that the embodiments described are examples only. Accordingly, the voltage level shifter, and the embedded nonvolatile memory and the system using the same described herein should not be limited based on the described embodiments.

What is claimed is:

1. A voltage level shifter comprising:
    a first input unit suitable for receiving a first input signal and forming a current path of a negative output node;
    a second input unit suitable for receiving a second input signal and forming a current path of a positive output node;
    a first PMOS transistor having a source receiving a first voltage and a drain coupled with the negative output node;
    a second PMOS transistor having a source receiving the first voltage and a drain coupled with the positive output node;
    a first clamping transistor having a gate receiving a second voltage, a drain coupled with the positive output node, and a source coupled with a gate of the first PMOS transistor; and
    a second clamping transistor having a gate receiving the second voltage, a drain coupled with the negative output node, and a source coupled with a gate of the second PMOS transistor,
    wherein the first PMOS transistor is directly connected to the first input unit, and the second PMOS transistor is directly connected to the second input unit.

2. The voltage level shifter according to claim 1, wherein the first input unit comprises a first NMOS transistor,
    wherein the first NMOS transistor includes a gate which receives the first input signal, a drain which is coupled with the negative output node, and a source which is coupled with a terminal of a third voltage.

3. The voltage level shifter according to claim 1, wherein the second input unit comprises a second NMOS transistor,
    wherein the second NMOS transistor includes a gate which receives the second input signal, a drain which is coupled with the positive output node, and a source which is coupled with the terminal of the third voltage.

4. The voltage level shifter according to claim 1, wherein the first input signal and the second input signal are complementary signals.

5. The voltage level shifter according to claim 1, wherein the second voltage has a level lower than the first voltage.

6. The voltage level shifter according to claim 1,
    wherein the second voltage is a difference between the first voltage and an operation voltage of the first PMOS transistor or the second PMOS transistor.

7. A voltage level shifter comprising:
    a first input unit suitable for receiving a first input signal and coupling a negative output node with a terminal of a ground voltage;
    a second input unit suitable for receiving a second input signal and coupling a positive output node with the terminal of the ground voltage;
    a first mirror transistor having a source receiving a pumping voltage and a drain coupled with the negative output node;
    a second mirror transistor having a source receiving the pumping voltage, and a drain coupled with the positive output node;
    a first clamping transistor having a gate receiving a clamping voltage, a source coupled with a gate of the first mirror unit, and a drain coupled with the positive output node; and
    a second clamping transistor having a gate receiving the clamping voltage, a source coupled with a gate of the second mirror unit, and a drain coupled with the negative output node,
    wherein the first mirror transistor is directly connected to the first input unit, and the second mirror transistor is directly connected to the second input unit.

8. The voltage level shifter according to claim 7, wherein the first input unit comprises a first NMOS transistor,
    wherein the first NMOS transistor includes a gate which receives the first input signal, a drain which is coupled with the negative output node, and a source which is coupled with the terminal of the ground voltage.

9. The voltage level shifter according to claim 7, wherein the second input unit comprises a second NMOS transistor,
    wherein the second NMOS transistor includes a gate which receives the second input signal, a drain which is coupled with the positive output node, and a source which is coupled with the terminal of the ground voltage.

10. The voltage level shifter according to claim 7, wherein the first input signal and the second input signal are complementary signals.

11. The voltage level shifter according to claim 7, wherein the clamping voltage has a level lower than the pumping voltage.

12. The voltage level shifter according to claim 7, wherein the level of the clamping voltage is between a level of the pumping voltage and an operation voltage of the first and second mirror transistors.

13. A voltage level shifter comprising:
- a first NMOS transistor having a gate receiving a first input signal, a drain coupled with a negative output node, and a source coupled with a terminal of a third voltage;
- a second NMOS transistor having a gate receiving a second input signal, a drain coupled with a positive output node, and a source coupled with the terminal of the third voltage;
- a first PMOS transistor having a source receiving a first voltage and a drain coupled with the negative output node;
- a second PMOS transistor having a source receiving the first voltage and a drain coupled with the positive output node;
- a first clamping transistor having a gate receiving a second voltage, a drain coupled with the positive output node, and a source coupled with a gate of the first PMOS transistor; and
- a second clamping transistor having a gate receiving the second voltage, a drain coupled with the negative output node, and a source coupled with a gate of the second PMOS transistor,
- wherein the first PMOS transistor is directly connected to the first NMOS transistor, and the second PMOS transistor is directly connected to the second NMOS transistor.

14. The voltage level shifter according to claim 13, wherein the clamping voltage has a level lower than the first voltage and higher than the third voltage.

15. The voltage level shifter according to claim 13, wherein the level of the clamping voltage is between a level of the first voltage and an operation voltage of the first and second PMOS transistors.

* * * * *